(12) United States Patent
Achir et al.

(10) Patent No.: US 9,281,842 B2
(45) Date of Patent: Mar. 8, 2016

(54) METHOD AND DEVICE FOR IMPROVING DECODING OF DATA RECEIVED FROM ONE SOURCE BY SEVERAL RECEIVERS

(71) Applicant: CANON KABUSHIKI KAISHA, Tokyo (JP)

(72) Inventors: Mounir Achir, Chantepie (FR); Philippe Le Bars, Thorigne Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 202 days.

(21) Appl. No.: 14/092,555

(22) Filed: Nov. 27, 2013

(65) Prior Publication Data
US 2014/0157093 A1   Jun. 5, 2014

(30) Foreign Application Priority Data
Dec. 3, 2012 (GB) .................................. 1221713.9

(51) Int. Cl.
| H03M 13/11 | (2006.01) |
| H03M 13/37 | (2006.01) |
| H03M 13/05 | (2006.01) |
| H03M 13/00 | (2006.01) |

(52) U.S. Cl.
CPC ...... *H03M 13/1128* (2013.01); *H03M 13/1102* (2013.01); *H03M 13/1111* (2013.01); *H03M 13/3761* (2013.01); *H03M 13/3769* (2013.01); *H03M 13/3776* (2013.01); *H03M 13/6306* (2013.01); *H03M 13/05* (2013.01)

(58) Field of Classification Search
CPC ..................... H03M 13/1128; H03M 13/1102; H03M 13/3761; H03M 13/3776; H03M 13/05
See application file for complete search history.

(56) References Cited

U.S. PATENT DOCUMENTS

| 5,727,075 | A  | * | 3/1998 | Aoyagi ......................... 381/106 |
| 6,145,111 | A  | * | 11/2000 | Crozier et al. ................. 714/755 |
| 6,356,607 | B1 | * | 3/2002 | Scott et al. .................... 375/354 |
| 2002/0161851 | A1 | * | 10/2002 | Chang ........................... 709/217 |
| 2002/0162071 | A1 | * | 10/2002 | Chang ........................... 714/777 |
| 2003/0137956 | A1 | * | 7/2003 | Salehi et al. ................... 370/335 |
| 2007/0041458 | A1 | * | 2/2007 | Hocevar et al. ............... 375/260 |
| 2009/0195455 | A1 | * | 8/2009 | Kim et al. ...................... 342/377 |
| 2010/0058149 | A1 |   | 3/2010 | Lunglmayr et al. |
| 2011/0158189 | A1 | * | 6/2011 | Kuo et al. ...................... 370/329 |
| 2012/0020425 | A1 | * | 1/2012 | Lee et al. ....................... 375/267 |
| 2012/0233521 | A1 |   | 9/2012 | Kwok et al. |

FOREIGN PATENT DOCUMENTS

| FR | 2 924 288 A1 | 5/2009 |
| GB | 2 431 836 A  | 2/2007 |

\* cited by examiner

*Primary Examiner* — Joseph D Torres

(74) *Attorney, Agent, or Firm* — Canon U.S.A., Inc. IP Division

(57) ABSTRACT

Improving decoding of a set of k data symbols received from several receivers, the data symbols being encoded by a systematic block error correcting code of dimension k and size n. The set of data symbols is received along with a corresponding subset of parity symbols, forming a partial data block comprising m symbols. A partial data block transmitted by one emitter, comprising a set of k data symbols and a subset of (m−k) parity symbols, is received from each receiver. For each received partial data block, a subset of parity symbols is generated and an item of reliability information is computed as a function of the received parity symbols and parity symbols generated from a received set of data symbols. The items of computed reliability information are compared with each other to select one received set of data bits.

20 Claims, 4 Drawing Sheets

Fig. 1a
$$H = \begin{pmatrix} 1 & 1 & 1 & 0 & 0 & 0 & 0 & 0 \\ 0 & 0 & 0 & 1 & 1 & 1 & 0 & 0 \\ 1 & 0 & 0 & 1 & 0 & 0 & 1 & 0 \\ 0 & 1 & 0 & 0 & 1 & 0 & 0 & 1 \end{pmatrix}$$
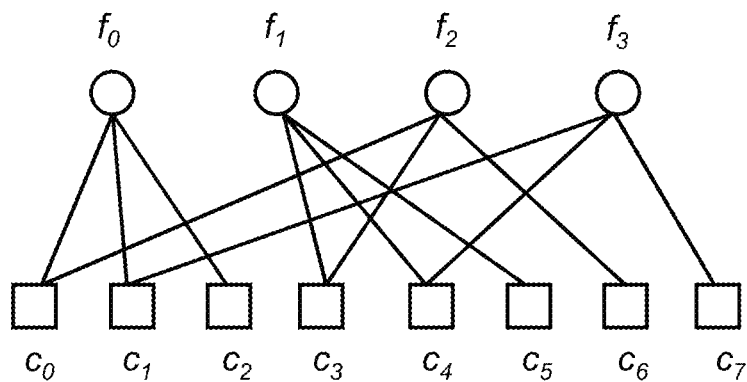
Fig. 1b
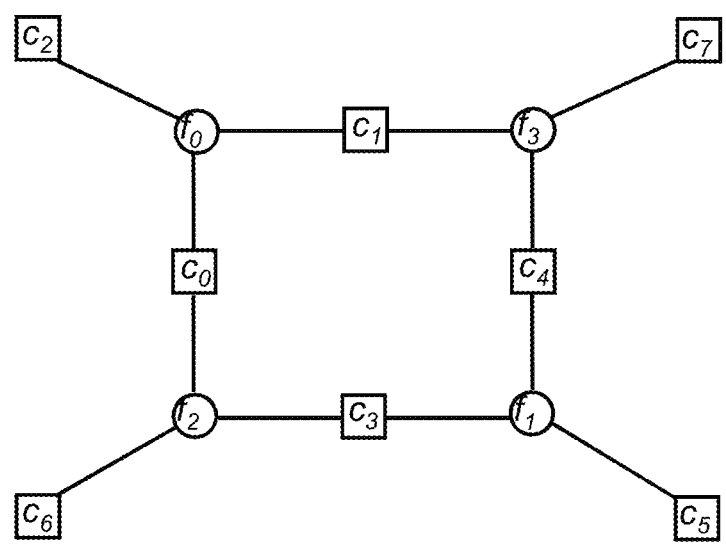
Fig. 1c

METHOD AND DEVICE FOR IMPROVING DECODING OF DATA RECEIVED FROM ONE SOURCE BY SEVERAL RECEIVERS

This application claims the benefit under 35 U.S.C. §119 (a)-(d) of United Kingdom Patent Application No. 1221713.9, filed on Dec. 3, 2012 and entitled "Method and device for improving decoding of data received from one source by several receivers". The above cited patent application is incorporated herein by reference in its entirety.

FIELD

The present subject matter relates generally to the wireless transmission of data, in particular of uncompressed high definition (HD) video or image data, for applications requiring a low Bit Error Rate (BER) and a low latency transmission. More specifically, the subject matter relates to a method and a device for improving decoding of data received from one source by several receivers. In particular, the subject matter may relate to a 60 GHz wireless network system using one moving emitter and several unmoving receivers, the receivers being connected by wire to a system controller device that uses a decoding technique based on Low Density Parity Check (LDPC) codes to retrieve the HD video or image data.

BACKGROUND

A wireless network system using the millimeter wave frequency band (e.g. 60 GHz) is well adapted to the transmission of uncompressed High Definition (HD) video or image data. One of the most advantageous characteristics of a wireless network using the 60 GHz frequency band is a large available bandwidth. This large bandwidth allows very high data rate transmission (more than 3 Gbps at the application level).

However, a main drawback of a wireless network using the millimeter wave frequency band such as the 60 GHz frequency band is its sensitivity to the shadowing phenomenon. Static or moving obstacles such as furniture, objects and human beings can cut or disturb the communication path and cause transmission errors.

Several solutions exist to handle such wireless data transmission perturbations.

For example, French Patent application No FR2924288A1 discloses a Chase Erasure Decoder to be used in a wireless mesh network. According to this document, a receiver node receives two copies of a same original Reed Solomon (RS) codeword (consisting of several symbols) transmitted from two different transmitter nodes (i.e. from two different independent radio communication paths).

After having received the two copies of a same RS codeword, the receiver node compares, symbol per symbol, the two different copies of the RS codeword to construct a resulting RS codeword. If the symbols of the two copies of the RS codeword are the same, the symbol value is duplicated in the resulting RS codeword. On the contrary, if the symbols of the two copies are different, the symbol is identified as an erasure in the resulting RS codeword.

In a following step, the number of erasures identified within the resulting RS codeword is compared to the decoding capacity of the RS decoder. If the number of erasures is equal to or is less than the RS decoder capacity, the resulting RS codeword is sent directly to the RS decoder to be decoded. On the contrary, if the number of erasures is greater than the capacity of the RS decoder, the resulting codeword cannot be sent directly to the RS decoder. In that case, the first symbols identified as erasures in the resulting RS codeword are replaced by the corresponding symbols of one of the received copies of the RS codeword.

The modified resulting RS codeword is sent to the RS decoder to be decoded. If the output of the RS decoder is not correct, a new iteration is done by replacing another set of symbols identified as erasures in the resulting RS codeword by the corresponding symbols of one of the received copies of the RS codeword. Iterations are stopped when the RS decoder output is correct or when all possible symbol replacements have been tested.

As another example, U.S. Patent Application Publication No. US2010/026900 discloses a method for a multi-reception wireless system. According to this document, the receiver that receives several copies of the same packet sent by a source, representing the original data to be retrieved, splits each received copy into multiple sub-packets. These sub-packets are then combined to reconstruct a packet that is subject to a CRC computation. If the CRC check is positive, the reconstructed packet is presented to the upper layer of the receiver. Such a method provides good performance when at least one of the received copies has a low bit error rate.

Another decoding technique that can be used in a multi-reception wireless system is based on the known majority or quorum decision scheme. According to the majority decision scheme, the output of the decoder corresponds to the data that are the most represented at the input of the decoder. Such a decoding technique is efficient if the considered radio communication paths have similar BER.

SUMMARY

Faced with these constraints, the inventors provide a method and a device for improving decoding of data received from one source by several receivers.

It is a broad object of the subject matter to remedy the shortcomings of the prior art as described above.

According to a first aspect there is provided a method for improving decoding of at least one set of k data symbols received from a plurality of receivers, the data symbols being encoded by a systematic block error correcting code of dimension k and size n, k being smaller than n, the set of data symbols being received along with a corresponding subset of parity symbols, forming a partial data block comprising m symbols, m being smaller than n, the method comprising:
  receiving, from each receiver of a plurality of receivers, a
    partial data block transmitted by one emitter, the
    received partial data block comprising a set of k data
    symbols and a subset of (m−k) parity symbols;
  for each received partial data block,
    generating at least a subset of parity symbols from the
      received set of data symbols;
    computing an item of reliability information as a function of at least the received parity symbols and parity
      symbols generated from a received set of data symbols;
  comparing the items of computed reliability information
    with each other; and
  selecting one received set of data bits as a function of
    comparing the items.

The claimed method provides an efficient decoding of different copies of the same data packet received from several receivers. A particular application of the claimed method is directed to the transmission of high resolution images from a robot eye to a plurality of wireless system receivers that are connected by wire links to a wireless system controller where data are combined and decoded, the wire links having a limited bitrate.

In an embodiment, computing an item of reliability information as a function of at least the received parity symbols and generated parity symbols comprises comparing the received subset of parity symbols with the corresponding subset of generated parity symbols.

In an embodiment, comparing the received subset of parity symbols with the corresponding subset of generated parity symbols comprises computing a distance between the parity symbols of the received subset and of the corresponding subset of generated parity symbols.

In an embodiment, the selected received set of data symbols is the received set of data symbols corresponding to the smallest distance between the parity symbols of the received subset and of the corresponding subset of generated parity symbols.

In an embodiment, a set of (n−k) parity symbols is generated for each received partial data block and computing an item of reliability information as a function of at least the received parity symbols and generated parity symbols comprises replacing parity symbols of a generated set of parity symbols by received parity symbols to obtain a modified set of parity symbols, the item of reliability information being computed as a function of at least the modified set of parity symbols and the received data symbols.

In an embodiment, computing an item of reliability information as a function of at least the received parity symbols and generated parity symbols comprises computing a product of a parity check matrix and a vector resulting from the concatenation of the received data symbols and the modified set of parity symbols.

In an embodiment, computing an item of reliability information as a function of at least the received parity symbols and parity symbols generated from a received set of data symbols comprises computing the item of reliability information as a function of at least the received parity symbols and parity symbols generated from data symbols of the partial data block being processed.

In an embodiment, the method further comprises the following:
  receiving, in at least one receiver of the plurality of receivers, a data block comprising the set of k data symbols and a set of (n−k) parity symbols; and
  selecting the subset of (m−k) parity symbols from among the received set of (n−k) parity symbols.

In an embodiment, the method further comprises transmitting the partial data block from the at least one receiver to a controller, the controller carrying out receiving, from each receiver of a plurality of receivers, a partial data block transmitted by one emitter, the received partial data block comprising a set of k data symbols and a subset of (m−k) parity symbols.

In an embodiment, the systematic block error correcting code is of the Low-Density Parity-Check type.

In an embodiment, data symbols are data bits and/or parity symbols are parity bits.

A second aspect provides for a computer readable medium storing instructions that, when executed by one or more computing devices, causes the one or more computing devices to carry out the methods as described above.

A third aspect provides an apparatus for improving decoding of at least one set of k data symbols received from a plurality of receivers, the data symbols being encoded by a systematic block error correcting code of dimension k and size n, k being smaller than n, the set of data symbols being received along with a corresponding subset of parity symbols, forming a partial data block comprising m symbols, m being smaller than n, the apparatus comprising
  receiving means for receiving, from each receiver of a plurality of receivers, a partial data block transmitted by one emitter, the received partial data block comprising a set of k data symbols and a subset of (m−k) parity symbols;
  processing means for processing each received partial data block, the processing means being configured for executing,
    generating at least a subset of parity symbols from the received set of data symbols;
    computing an item of reliability information as a function of at least the received parity symbols and parity symbols generated from a received set of data symbols;
  comparing means for comparing the items of computed reliability information with each other; and
  selecting means for selecting one received set of data bits as a function of comparing the items of computed reliability information with each other.

Accordingly, the claimed apparatus provides efficient means for decoding of different copies of the same data packet received from several receivers.

In an embodiment, the processing means are further configured so that computing an item of reliability information as a function of at least the received parity symbols and generated parity symbols comprises comparing the received subset of parity symbols with the corresponding subset of generated parity symbols.

In an embodiment, the processing means are further configured so that comparing the received subset of parity symbols with the corresponding subset of generated parity symbols comprises computing a distance between the parity symbols of the received subset and of the corresponding subset of generated parity symbols.

In an embodiment, the selected received set of data symbols is the received set of data symbols corresponding to the smallest distance between the parity symbols of the received subset and of the corresponding subset of generated parity symbols.

In an embodiment, the processing means are configured to generate a set of (n−k) parity symbols for each received partial data block and are configured so that computing an item of reliability information as a function of at least the received parity symbols and generated parity symbols comprises replacing parity symbols of a generated set of parity symbols by received parity symbols to obtain a modified set of parity symbols, the item of reliability information being computed as a function of at least the modified set of parity symbols and the received data symbols.

In an embodiment, the processing means are configured so that computing an item of reliability information as a function of at least the received parity symbols and generated parity symbols comprises computing a product of a parity check matrix and a vector resulting from the concatenation of the received data symbols and the modified set of parity symbols.

In an embodiment, the processing means are configured so that computing an item of reliability information as a function of at least the received parity symbols and parity symbols generated from a received set of data symbols comprises computing the item of reliability information as a function of at least the received parity symbols and parity symbols generated from data symbols of the partial data block being processed.

In an embodiment, the apparatus further comprises:
second receiving means for receiving, in at least one receiver of the plurality of receivers, a data block comprising the set of k data symbols and a set of (n−k) parity symbols; and
second selecting means for selecting the subset of (m−k) parity symbols from among the received set of (n−k) parity symbols.

In an embodiment, the apparatus further comprises transmitting means for transmitting the partial data block from the at least one receiver to a controller, the controller comprising means for carrying out receiving, from each receiver of a plurality of receivers, a partial data block transmitted by one emitter, the received partial data block comprising a set of k data symbols and a subset of (m−k) parity symbols.

Since the present subject matter can be implemented in software, the present subject matter can be embodied as computer readable code for provision to a programmable apparatus on any suitable carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Further advantages of the present subject matter will become apparent to those skilled in the art upon examination of the drawings and detailed description. It is intended that any additional advantages be incorporated herein.

FIG. 1, comprising FIGS. 1a to 1c, represents an example of a Tanner graph and of an organized graph for a particular parity check matrix H.

FIG. 3, comprising

DETAILED DESCRIPTION

Figure 2:
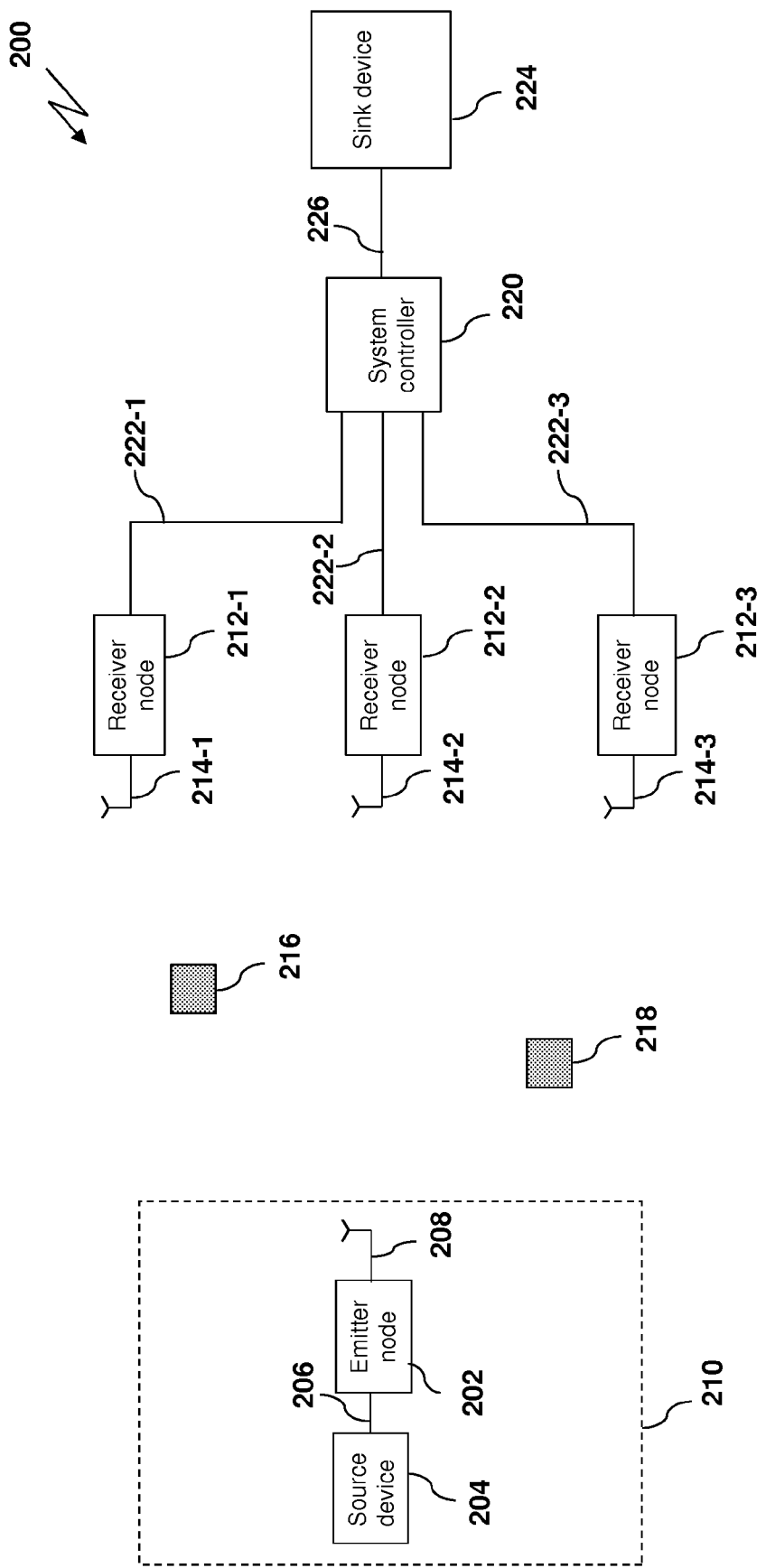
FIG. 2 illustrates a typical configuration of a 60 GHz wireless network system wherein embodiments of the subject matter can be implemented.

According to a particular embodiment, the multi-reception technique is used to create space diversity and the Low-Density Parity-Check (LDPC) channel coding technique is used to attain a low Bit Error Rate (BER) as well as a low latency so as to act against transmission errors in a wireless transmission system, in particular in a 60 GHz wireless transmission system.

For the sake of clarity, the following description is based on the encoding of data as a sequence of bits comprising data bits and possibly parity bits. However, data may also be encoded as a sequence of symbols (i.e. non binary characters).

Firstly, it is to be recalled that an LDPC code is a systematic block error correcting code. More precisely, an LDPC code is a parity-check code whose parity-check matrix H is a low-density parity-check matrix, that is to say a parity-check matrix having a vast majority of elements equal to zero. A parity-check matrix is regular if each code bit is included in a fixed number of parity checks, noted Nc, and each parity-check equation contains a fixed number of code bits, noted Nv. If an LDPC code is described by a regular parity-check matrix it is called a (Nc, Nv) regular LDPC code. Otherwise it is an irregular LDPC code.

An LDPC code can be seen as a variable set that satisfies a set of constraints. A graph can be constructed to represent the relationship between the variables and the constraints. Variables will be represented by a square and constraints by a circle.

For the sake of illustration, a binary linear code C can be defined by the following parity check matrix:

$$H = \begin{bmatrix} 1 & 1 & 1 & 0 & 0 & 0 & 0 & 0 \\ 0 & 0 & 0 & 1 & 1 & 1 & 0 & 0 \\ 1 & 0 & 0 & 1 & 0 & 0 & 1 & 0 \\ 0 & 1 & 0 & 0 & 1 & 0 & 0 & 1 \end{bmatrix}$$

Accordingly, binary linear code C is the set of all binary 8-tuples $X=[x_1, x_2, x_3, x_4, x_5, x_6, x_7, x_8]$ that satisfies the following relation:

$$H \cdot X^t = 0$$

Therefore, according to the given example, verifying that 8-tuples X belong to binary linear code C is equivalent to verifying the following conditions:

$$x_1 + x_2 + x_3 = 0;$$

$$x_4 + x_5 + x_6 = 0;$$

$$x_1 + x_4 + x_7 = 0; \text{ and}$$

$$x_2 + x_6 + x_8 = 0.$$

The constraint here is to satisfy several parities. The function associated with the constraint is the sum in GF(2), i.e. a Galois Field. The satisfaction of all the constraints may be depicted in a graph that represents the code. It is called a Tanner graph.

FIG. 1, comprising FIGS. 1a to 1c, represents the Tanner graph (FIG. 1b) and the organized graph (FIG. 1c) corresponding to the given example of the parity check matrix H (FIG. 1a) wherein c elements represent components of a vector to be checked and f elements represent check nodes Typically, the parity check matrix is used to generate a generator matrix that is used to encode data. For example, the parity check matrix H can be put in the form $[P^T\ I]$ via Gaussian elimination to obtain the generator matrix G (G=[I P]).

An LDPC optimal decoding such as the Belief Propagation decoding Algorithm (BPA) aims to estimate the probability that a given received sample is equal to 1 or 0 as a function of its own value and the values of the different check nodes that relate to this sample. The belief propagation decoding algorithm, also called sum-product decoding, was introduced by Gallager in his thesis where he applied it to decode LDPC codes generated randomly.

The BPA is as follows:
$\alpha_{ij}$ and $\beta_{ij}$ variables definition:

$$L(q_{ij}) = \alpha_{ij} \cdot \beta_{ij}$$

$$\alpha_{ij} = \text{sign}(L(q_{ij}))$$

$$\beta_{ij} = \text{abs}(L(q_{ij}))$$

Initialization:

$$L(c_i) = 2y_i/\sigma^2$$

$$L(q_{ij}) = L(c_i)$$

with $y_i$ being the $i^{th}$ sample received (considering the following binary phase-shift keying modulation: 1 for 0 and −1 for 1) and $\sigma$ is the standard deviation of the noise.

Step 1: send a message to a check node for a response computation $L(r_{ji})$ $$L(r_{ji}) = \phi\left(\sum_{i' \in R_{j/i}} \phi(\beta_{i'j})\right) \cdot \prod_{i' \in R_{j/i}} \alpha_{i'j}$$

with $\phi(x) = \log\left(\dfrac{e^x + 1}{e^x - 1}\right)$

Step 2: Reception of the responses and computation of the new message $$L(q_{ij}) = L(c_i) + \sum_{j' \in C_{i/j}} L(r_{j'i})$$

steps 1 and 2 being repeated for a given number of iterations.
Step 3: Computation of the soft-decision by using the following formula:

$$L(Q_i) = L(c_i) + \sum_{j' \in C_i} L(r_{ji})$$

Step 4: computation of the hard decision by the following test
if $L(Qi) < 0$ then $c_i = 1$
else $c_i = 0$ In this algorithm, knowing the standard deviation of the noise is necessary. This requires an estimation of the signal to noise ratio. A simple manner to avoid this estimation is to apply a sub-optimal decoding considering that:

$$L(c_i) = y_i$$

Another simplification can be made when computing the following equation $$\phi\left(\sum_{i' \in R_{j/i}} \phi(\beta_{i'j})\right).$$

The latter can be approximated by the formula $$\phi\left(\phi\left(\min_{i'} \beta_{i'j}\right)\right)$$

which is equal to $$\min_{i'} \beta_{i'j}.$$

The expression of step 1 becomes $$L(r_{ji}) = \min_{i'} \beta_{i'j} \cdot \prod_{i' \in R_{j/i}} \alpha_{i'j}.$$

FIG. 2 illustrates a typical configuration of a 60 GHz wireless network system wherein embodiments of the subject matter can be implemented.

Wireless network 200 comprises a wireless emitter node 202 (or wireless system emitter, WSE) that is connected to a High Definition video or image data source device 204 through a wire interface 206. The source device 204 can be, for example, an HD digital camera or an HD digital camcorder.

To be transmitted, the HD video or image data is processed by the wireless emitter node 202. Typically, the HD video or image data is encoded using an LDPC encoding scheme to improve data transmission reliability.

The processed data are then wirelessly sent through antenna 208 which is connected to wireless emitter node 202.

It is to be noted that the system comprising source device 204, wireless emitter node 202 and antenna 208 can move within the area 210 and thus, the processed data can be sent from different positions within area 210.

The transmitted data are received by several receiver nodes (or wireless system receivers, WSR), for example wireless receiver nodes 212-1, 212-2, and 212-3 through antennae 214-1, 214-2, and 214-3, respectively, as illustrated. Wireless receiver nodes 212-1, 212-2, and 212-3 are advantageously located at different positions to create space diversity. According to the illustrated particular embodiment, three receiver nodes are used. Naturally, other configurations could be used, for example configurations with two, four, five, or six receiver nodes.

Grey blocks 216 and 218 represent some obstacles that are situated between wireless emitter node 202 and wireless receiver nodes 212-1, 212-2, and 212-3. For the sake of illustration, these obstacles can be physical objects, human beings, and/or furniture.

Depending on the position of wireless emitter node 202 within area 210 and depending on the position of obstacles 216 and 218, one or more line of sight communication paths between wireless emitter node 202 and wireless receiver nodes 212-1, 212-2, and 212-3 can be disturbed or shadowed. As a result, receiver nodes 212-1, 212-2, and 212-3 may have different reception quality, i.e. different BER.

Wireless receiver nodes 212-1, 212-2, and 212-3 process the data received from the wireless emitter node 202 and send the processed data to the wireless system controller 220 (WSC) through the wire interfaces 222-1, 222-2 and 222-3, respectively. Accordingly, the wireless system controller 220 receives three copies of the same original data from the wireless receiver 212-1, 212-2, and 212-3. The three received copies are addressed to an LDPC multi-receiving decoding module (shown in FIG. 3b) embedded within the wireless system controller 220. The LDPC multi-receiving decoding module uses a decoding technique based on LDPC to retrieve the HD video or image data.

According to a particular embodiment, the LDPC multi-receiving decoding module is modified so as to determine an item of reliability information indicative of potential corruption of a data block. Examples of algorithms for determining such an item of reliability information are described with reference to FIGS. 4 and 5.

The decoded HD video or image data are sent from the wireless system controller 220 to a sink device 224 through a wire interface 226. The sink device 224 can be an HD video or image display, a Personal Computer, or the like.

The functional architecture of the wireless emitter node 202, the receiver nodes 212-1, 212-2, and 212-3, and the wireless system controller 220 is illustrated in FIG. 3.

Figure 3A:
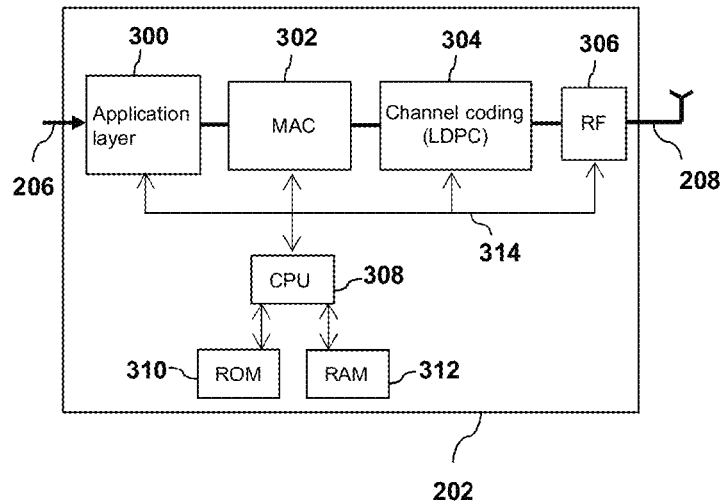
FIGS. 3a and 3b, illustrates an example of functional block diagrams of a wireless emitter node, a receiver node, and a wireless system controller of a wireless transmission system wherein embodiments of the subject matter can be implemented, such as the one described with reference to FIG. 2.
Figure 3B:
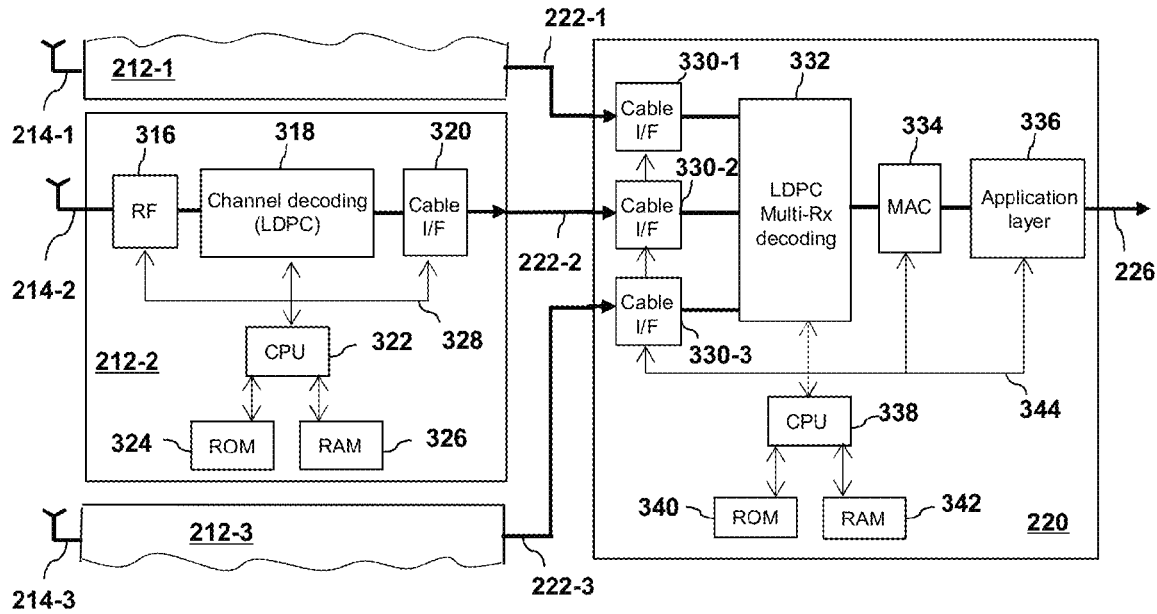

FIG. 3, comprising FIGS. 3a and 3b, illustrates an example of functional block diagrams of a wireless emitter node, a receiver node, and a wireless system controller of a wireless transmission system wherein embodiments of the subject matter can be implemented, such as the one described by reference to FIG. 2.

As illustrated in FIG. 3a, wireless emitter node 202 is connected to an HD video or image source device (not shown) through wire interface 206. Wire interface 206 can be, for example, an interface of the HDMI (High Definition Multimedia Interface) type or of the Camera Link type. More precisely, the source device is connected to a particular module referenced 300 of the wireless emitter node 202 via the wire interface 206. The module 300 is the application layer module of the wireless emitter node 202.

Application layer module 300 aims at receiving a HD video or image content from the source device and at formatting the received data to be processed by MAC (Media Access Control) layer module 302. Accordingly, once formatted, data are sent to MAC layer module 302.

MAC module 302 receives the formatted data sent from application layer module 300 and builds MAC data packets. It is to be recalled that a MAC data packet typically comprises control data and payload (i.e. application data). For the sake of illustration, a MAC data packet can comprise a header that contains a data packet type, a destination address, a source address, a sequence number, application data, and CRC bits.

The built MAC data packets are sent to channel coding module 304 which provides a channel encoding function. To that end, MAC data packets are considered as raw data, that is to say as undifferentiated data that are encoded as a whole. Typically, encoding data comprises computing parity bits from the data to encode (i.e. data bits) and merging the parity bits with the data bits to create encoded MAC data packets referred to herein below as data blocks.

According to a particular embodiment, channel coding module 304 encodes the MAC data packets using an LDPC (256, 512) encoder.

As illustrated, the output of channel coding module 304 is connected to RF (Radio Frequency) transceiver module 306.

On reception of data blocks (i.e. channel encoded MAC data packets), the RF transceiver 306 builds radio packets by modulating the received data and adding a preamble pattern. The RF transceiver module 306 advantageously provides all the functions needed for the transmission of radio packets on a 60 GHz radio channel through the antenna 208.

The wireless emitter node 202 further comprises CPU (Central Processing Unit) 308 as well as memory modules 310 and 312 of the ROM (Read-Only Memory) type and the RAM (Random Access Memory) type, respectively, which are connected to CPU 308.

Typically, the memory modules of the ROM type are used to store software programs that can be used, when executed by CPU 308, using the memory modules of the RAM type, to implement embodiments of the subject matter.

CPU 308 is connected to modules 300 to 306 via a bi-directional address/data bus 314. Amongst other tasks, bus 314 allows CPU 308 to initialize and configure modules 300 to 306 during system start-up.

FIG. 3b illustrates the functional block diagrams of wireless receiver node 212-2 and wireless system controller 220. The functional block diagrams of wireless receiver nodes 212-1 and 212-3 are advantageously similar to that of wireless receiver node 212-2.

As described above, wireless receiver node 212-2 receives data (i.e. radio packets) via antenna 214-2 which is connected to RF transceiver module 316.

For the sake of clarity, it is assumed that RF transceiver module 316 fulfills all the functions needed for the reception of radio packets on a 60 GHz radio channel through antenna 214-2.

After having received radio packets, RF transceiver module 316 removes the preamble pattern from the radio packet and demodulates the received radio packet to retrieve data blocks (i.e. channel encoded MAC data packets). The retrieved data blocks are then sent to channel decoding module 318 which performs a channel decoding function on reception of data packets.

According to the particular embodiment, channel decoding module 318 decodes the demodulated data using the LDPC decoding algorithm (belief propagation decoding algorithm) to retrieve original MAC data packet raw data and corresponding parity bits forming data blocks.

Once decoded, the retrieved original MAC data packet raw data and some of the corresponding parity bits are sent by channel decoding module 318 via cable interface (I/F) module 320 as partial data packets.

The number of parity bits that are sent (per data packet) is advantageously predetermined. According to a particular embodiment, one eighth of the number of parity bits is sent. Therefore, if 256 parity bits are associated with a 256 bits MAC data packet, only 32 parity bits are sent with the MAC data packet.

Cable interface module 320 receives the retrieved original MAC data packet raw data from the channel decoding module 318 along with corresponding parity bits and formats and transmits them to wireless system controller 220 via the wire link 222-2. Wire link 222-2 is typically a serial wire link able to support a data rate up to several Gbps.

Wireless receiver node 212-2 further comprises CPU 322 as well as memory modules 324 and 326 of the ROM type and the RAM type, respectively, which are connected to CPU 322.

Typically, the memory modules of the ROM type are used to store software programs that can be used, when executed by CPU 322, using the memory modules of the RAM type, to implement embodiments of the subject matter.

CPU 322 is connected to modules 316, 318, and 320 via bi-directional address/data bus 328. Amongst other tasks, bus 328 allows CPU 322 to initialize and configure modules 316, 318, and 320 during system start-up.

As described above, wireless receiver nodes 212-1, 212-2, and 212-3 are connected to wireless system controller 220. More precisely, system controller 220 receives three copies of each partial data packet (retrieved original MAC data packet raw data and some of the corresponding parity bits) from the three wireless receiver nodes 212-1, 212-2, and 212-3 via the wire link 222-1, 222-2, and 222-3, respectively.

A first copy of a partial data packet is transmitted by wireless receiver node 212-1 and received by the wireless system controller 220 via cable interface module 330-1. Cable interface module 330-1 processes the received data and sends the first copy of the received partial data packet to LDPC multi-receiving decoding module 332.

Similarly, a second and a third copy of the partial data packet are transmitted by wireless receiver nodes 212-2 and 212-3, respectively, and received by the wireless system controller 220 via cable interface modules 330-2 and 330-3, respectively. Cable interface modules 330-2 and 330-3 process the received data and send the second and third copies of the partial data packet to LDPC multi-receiving decoding module 332.

As described above, LDPC multi-receiving decoding module 332 is advantageously modified so as to determine an item of reliability information indicative of potential corruption of a data block. Examples of algorithms for determining such an item of reliability information are described by reference to FIGS. 4 and 5.

According to the described embodiment, LDPC multi-receiving decoding module 332 receives n copies of each partial data packet (comprising retrieved original MAC data packet raw data and some of the corresponding parity bits) received by n wireless system receivers (in the example illustrated in FIG. 3, n=3) from cable interface modules generically referred to as 330.

LDPC multi-receiving decoding module 332 processes the copies of the received partial data packets to select one of the copies of each received partial data packet from which is obtained a MAC data packet. Such a selection is based on an item of reliability information indicative of potential corruption of a data block as described with reference to FIGS. 4 and 5.

Selected MAC data packets are sent to MAC module 334 which processes each MAC data packet and retrieves the HD video or image data, typically by removing the header information attached to the MAC data packets. After having been retrieved, the HD video or image data are transmitted by MAC module 334 to application layer module 336.

Application layer module 336 receives the HD video or image data from MAC module 334 and re-builds the HD video or image content that is sent to a sink device (not shown) through wire interface 226. The latter can be, for example, an interface of the HDMI type or of the Camera Link type.

Wireless system controller 220 further comprises CPU 338 as well as memory modules 340 and 342 of the ROM type and the RAM type, respectively, which are connected to CPU 338.

Typically, the memory modules of the ROM type are used to store software programs that can be used, when executed by CPU 338, using the memory modules of the RAM type, to implement embodiments of the subject matter.

CPU 338 is connected to modules 330, 332, 334, and 336 via bi-directional address/data bus 344. Amongst other tasks, bus 344 allows CPU 338 to initialize and configure modules 330, 332, 334, and 336 during system start-up.

Figure 4:
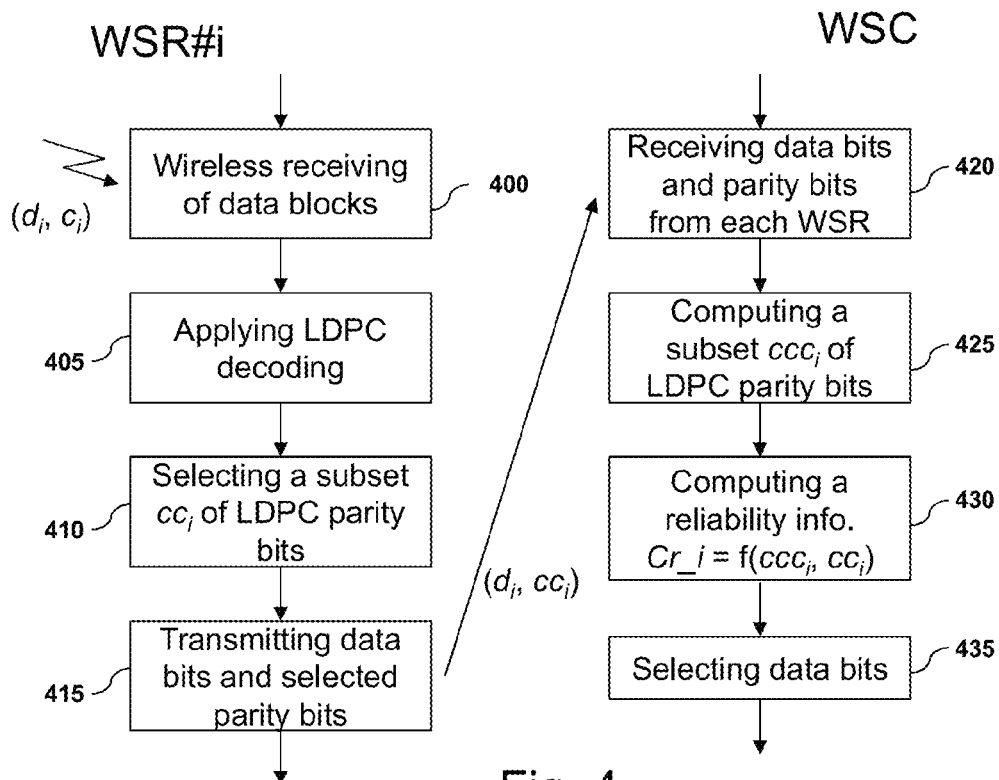
FIG. 4 is a flow chart illustrating steps of a method for determining an item of reliability information indicative of potential corruption of a data block among several received copies of a partial data block derived from that data block in accordance with a first embodiment of the subject matter.

FIG. 4 is a flow chart illustrating steps of a method for determining an item of reliability information indicative of potential corruption of a data block among several received copies of a partial data block derived from that data block in accordance with a first embodiment of the subject matter.

The steps depicted on the left side of FIG. 4 are implemented within each of the wireless system receivers, either sequentially or in a parallel way, while the steps depicted on the right side are implemented within the wireless system controller.

In a first step, each wireless system receiver i (WSR#i) receives at least one data packet sent by the wireless transmitter (step 400). Each data packet received by a wireless system receiver i comprises data bits $d_i$ and parity bits $c_i$. For the sake of illustration, a data packet can comprise 256 data bits and 256 parity bits.

Next, a decoding algorithm such as the LDPC algorithm (the belief propagation decoding algorithm described above) is applied to each of the received data blocks so as to correct, if needed, the received values (step 405).

In a following step, a subset $cc_i$ of received parity bits $c_i$ is selected (step 410), for each of the received data packets, and transmitted along with the corresponding data bits $d_i$ to the wireless system controller via a wire link (step 415) as a partial data block derived from the received data block. For the sake of example, the subset of parity bits can comprise 32 parity bits. According to this example, partial data blocks transmitted from a wireless system receiver to the wireless system controller comprise 256 data bits ($d_i$) and 32 parity bits ($cc_i$).

For the sake of illustration, the selected parity bits can be the 32 first parity bits among the 256 parity bits.

Since the steps 400 to 415 are implemented within several wireless system receivers, the wireless system controller receives several copies of the same partial data blocks each comprising data bits $d_i$ and a subset $cc_i$ of corresponding parity bits (step 420). Typically, a copy of each partial data block is received from each of the wireless system receivers, i.e. if n wireless system receivers are involved, n copies of each partial data packet are received by the wireless system controller.

After having received several copies of the same partial data block, the wireless system controller computes a new subset $ccc_i$ of parity bits from received data bits, for each copy of a received partial data packet (step 425). The number of parity bits of the new subset $ccc_i$ is preferably equal to that of the received subset $cc_i$, i.e. 32 bits in the described example.

According to a particular embodiment, only the parity bits of the new subset $ccc_i$ of parity bits are computed. Alternatively, all the parity bits corresponding to the received data bits $d_i$ can be computed.

In a following step (step 430), the computed parity bits of the new subset $ccc_i$ are compared to the parity bits of the received subset $cc_i$ in order to obtain an item of reliability information Cr_i indicative of potential corruption of the corresponding copy of the received partial data block and so of the received data block. For the sake of illustration, such an item of reliability information can be determined as being the Hamming distance between the subsets cci and ccci. It is computed for each received copy of a received partial data block:

$$Cr\_i = \sum_j |ccc_{i,j} - cc_{i,j}|$$

where i represents a wireless system receiver index and j represents a bit index within a bit subset.

It is to be noted that alternatively, the item of reliability information could be obtained by comparing the parity bits of the subset $cc_i$ received from wireless system receiver i (WSR#i) to the parity bits of a new subset $ccc_k$ computed as a function of data bits received from wireless system receiver k (WSR#k).

In a following step (step 435), the data bits of a copy of a received partial data packets are selected from among the data bits of the copies of the same received partial data packet. The selected data bits are advantageously the ones that correspond to the smallest computed Hamming distance, i.e. the ones received from the wireless system receiver having index k (WSR#k) such that:

$$Cr\_k = \min_i(Cr\_i)$$

The selected data bits are considered as being the more reliable ones, the others being preferably ignored in the following data processing steps (e.g. to re-construct a video frame or an image).

While the selection of a set of data bits can be based on the Hamming distance values between subsets of parity bits, such a selection can be based on other criteria.

Figure 5:
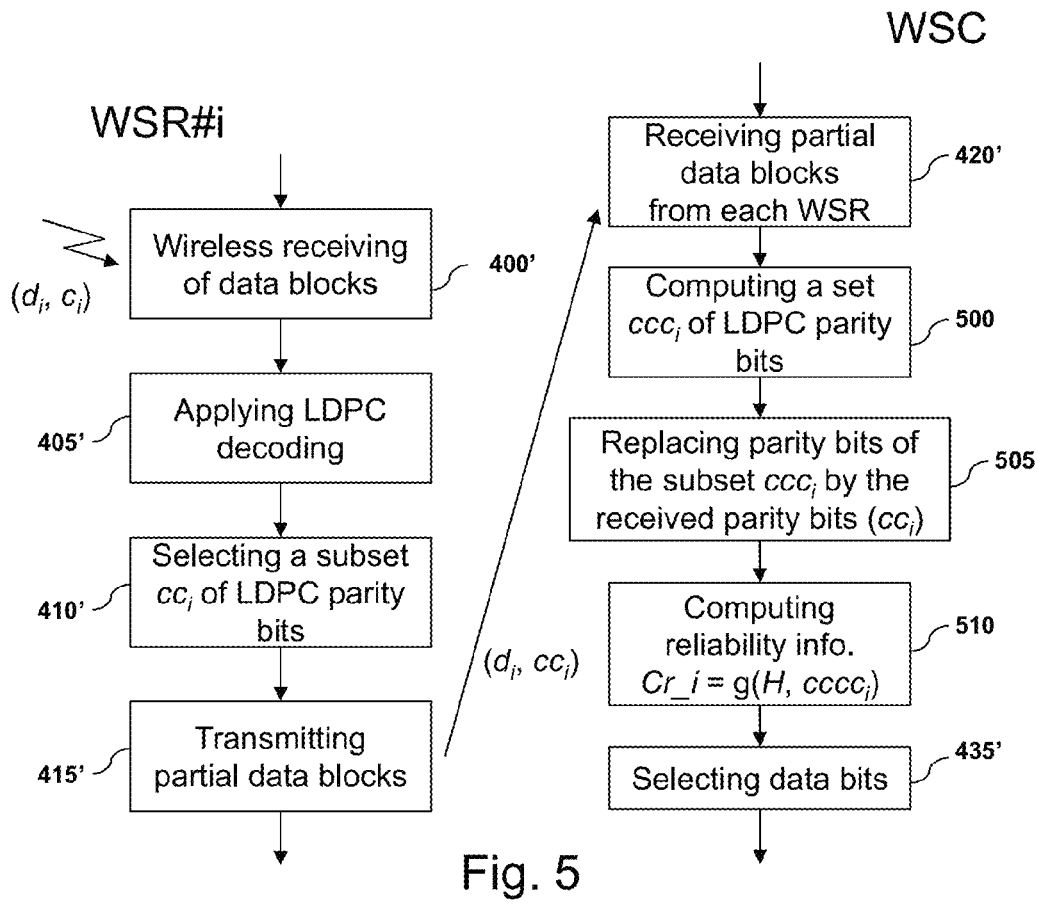
FIG. 5 is a flow chart illustrating steps of a method for determining an item of reliability information indicative of potential corruption of a data block among several received copies of a partial data block derived from that data block in accordance with a second embodiment of the subject matter.

FIG. 5 is a flow chart illustrating steps of a method for determining an item of reliability information indicative of potential corruption of a data block among several received copies of a partial data block derived from that data block in accordance with a second embodiment of the subject matter.

Similarly to the steps described with reference to FIG. 4, the steps shown on the left side of FIG. 5 are implemented within each of the wireless system receivers, either sequentially or in a parallel way, while the steps shown on the right side are implemented within the wireless system controller.

Likewise, in a first step, each wireless system receiver i (WSR#i) receives at least one data packet sent by the wireless transmitter (step 400'). Each data packet received by a wireless system receiver i comprises data bits $d_i$ and parity bits $c_i$. Again, for the sake of illustration, a data packet can comprise 256 data bits and 256 parity bits.

Next, a decoding algorithm such as the LDPC algorithm (the belief propagation decoding algorithm described above) is applied to each of the received data blocks so as to correct, if needed, the received values (step 405').

In a following step, a subset $cc_i$ of parity bits $c_i$ is selected (step 410'), for each of the received data packets, and transmitted along with the corresponding data bits $d_i$ to the wireless system controller via a wire link (step 415') as a partial data block derived from the received data block. For the sake of example, the subset of parity bits can comprise 32 parity bits. According to this example, partial data blocks transmitted from a wireless system receiver to the wireless system controller comprise 256 data bits ($d_i$) and 32 parity bits ($cc_i$).

Still for the sake of illustration, the selected parity bits can be the 32 first parity bits among the 256 parity bits.

Again, since the steps 400' to 415' are implemented within several wireless system receivers, the wireless system controller receives several copies of the same partial data blocks each comprising data bits $d_i$ and a subset $cc_i$ of corresponding parity bits (step 420'). Typically, a copy of each partial data block is received from each of the wireless system receivers, i.e. if n wireless system receivers are involved, n copies of each partial data packet are received by the wireless system controller.

After having received several copies of the same partial data block, the wireless system controller computes a new set $ccc_i$ of parity bits from received data bits, for each copy of a received partial data packet (step 500). The new set $ccc_i$ of parity bits comprises all the parity bits as obtained from the LDPC generator matrix of the used code and the received data bits. Since only a subset $cc_i$ of parity bits is received, the number of parity bits of the new set $ccc_i$ is greater than that of received parity bits.

In a following step (step 505), the parity bits of the set $ccc_i$ that correspond to the received parity bits of the subset $cc_i$ are replaced by the corresponding received parity bits in order to obtained a modified set $cccc_i$ of parity bits. If the new set $ccc_i$ comprises 256 parity bits and if the received subset $cc_i$ comprises 32 parity bits, the modified set $cccc_i$ comprises 224 parity bits of the new set $ccc_i$ and the 32 parity bits of the received subset $cc_i$.

In a following step (step 510), an item of reliability information Cr_i indicative of potential corruption of the corresponding copy of the received partial data block (and thus of the received data block) is computed for each received copy. According to a particular embodiment, such an item of reliability information is computed according to the following formula:

$$Cr\_i = \sum_j \mod(H_j.W_{i,j}, 2)$$

where i represents a wireless system receiver index, j represents a bit index within a bit set, H is the parity check matrix, and Wi is a vector obtained by concatenating data bits $d_i$ and the parity bits of the modified set $cccc_i$.

It is to be noted that alternatively, the item of reliability information could be computed as a function of a vector Wi obtained by concatenating data bits $d_i$ received from wireless system receiver i (WSR#i) and parity bits of a set $cccc_k$ computed as a function of data bits received from wireless system receiver k (WSR#k), the set $cccc_k$ being modified according to the parity bits of the subset $cc_i$ received from WSR#i, as described above.

In a following step (step 435'), the data bits of a copy of a received partial data packet are selected among the data bits of the copies of a same received partial data packet. The selected data bits are advantageously the ones that correspond to the smallest value of the computed reliability information, i.e. the ones received from the wireless system receiver having index k (WSR#k) such that:

$$Cr\_k = \min_i(Cr\_i)$$

Again, the selected data bits are considered as being the more reliable ones, the others being preferably ignored in the following data processing steps (e.g. to re-construct a video frame or an image).

Naturally, in order to satisfy local and specific requirements, a person skilled in the art may apply to the solution described above many modifications and alterations all of which, however, are included within the scope of protection of the subject matter as defined by the following claims. In particular, embodiments of the subject matter can be implemented with systematic block error correcting codes other than LDPC codes.

The invention claimed is:

1. A method for improving decoding of at least one set of k data symbols received from a plurality of receivers, the data symbols being encoded by a systematic block error correcting code of dimension k and size n, k being smaller than n, the set of data symbols being received along with a corresponding subset of parity symbols, forming a partial data block comprising m symbols, m being smaller than n, the method comprising:

receiving, from each receiver of a plurality of receivers, a partial data block transmitted by one emitter, the received partial data block comprising a set of k data symbols and a subset of (m−k) parity symbols;

for each received partial data block, generating at least a subset of parity symbols from the received set of data symbols;

computing an item of reliability information as a function of at least the received parity symbols and parity symbols generated from a received set of data symbols;

comparing the items of computed reliability information with each other; and selecting one received set of data bits as a function of comparing the items.

2. The method of claim 1, wherein computing an item of reliability information as a function of at least the received parity symbols and generated parity symbols comprises comparing the received subset of parity symbols with the corresponding subset of generated parity symbols.

3. The method of claim 2, wherein comparing the received subset of parity symbols with the corresponding subset of generated parity symbols comprises computing a distance between the parity symbols of the received subset and of the corresponding subset of generated parity symbols.

4. The method of claim 3, wherein the selected received set of data symbols is the received set of data symbols corresponding to the smallest distance between the parity symbols of the received subset and of the corresponding subset of generated parity symbols.

5. The method of claim 1, wherein a set of (n−k) parity symbols is generated for each received partial data block and wherein computing an item of reliability information as a function of at least the received parity symbols and generated parity symbols comprises replacing parity symbols of a generated set of parity symbols by received parity symbols to obtain a modified set of parity symbols, the item of reliability information being computed as a function of at least the modified set of parity symbols and the received data symbols.

6. The method of claim 5, wherein computing an item of reliability information as a function of at least the received parity symbols and generated parity symbols comprises computing a product of a parity check matrix and a vector resulting from the concatenation of the received data symbols and the modified set of parity symbols.

7. The method of claim 1, wherein computing an item of reliability information as a function of at least the received parity symbols and parity symbols generated from a received set of data symbols comprises computing the item of reliability information as a function of at least the received parity symbols and parity symbols generated from data symbols of the partial data block being processed.

8. The method of claim 1 further comprising:
receiving, in at least one receiver of the plurality of receivers, a data block comprising the set of k data symbols and a set of (n−k) parity symbols; and
selecting the subset of (m−k) parity symbols from among the received set of (n−k) parity symbols.

9. The method of claim 8 further comprising transmitting the partial data block from the at least one receiver to a controller, the controller carrying the receiving of, from each receiver of a plurality of receivers, a partial data block transmitted by one emitter, the received partial data block comprising a set of k data symbols and a subset of (m−k) parity symbols.

10. The method of claim 1, wherein the systematic block error correcting code is of the Low-Density Parity-Check type.

11. A non-transitory computer readable medium storing instructions that, when executed by one or more computing devices, cause the one or more computing devices to perform a method for improving decoding of at least one set of k data symbols received from a plurality of receivers, the data symbols being encoded by a systematic block error correcting code of dimension k and size n, k being smaller than n, the set of data symbols being received along with a corresponding subset of parity symbols, forming a partial data block comprising m symbols, m being smaller than n, the method comprising:

receiving, from each receiver of a plurality of receivers, a partial data block transmitted by one emitter, the received partial data block comprising a set of k data symbols and a subset of (m−k) parity symbols;

for each received partial data block, generating at least a subset of parity symbols from the received set of data symbols;

computing an item of reliability information as a function of at least the received parity symbols and parity symbols generated from a received set of data symbols;

comparing the items of computed reliability information with each other; and selecting one received set of data bits as a function of comparing the items.

12. An apparatus for improving decoding of at least one set of k data symbols received from a plurality of receivers, the data symbols being encoded by a systematic block error correcting code of dimension k and size n, k being smaller than n, the set of data symbols being received along with a corresponding subset of parity symbols, forming a partial data block comprising m symbols, m being smaller than n, the apparatus comprising:

receiving means for receiving, from each receiver of a plurality of receivers, a partial data block transmitted by one emitter, the received partial data block comprising a set of k data symbols and a subset of (m−k) parity symbols;

processing means for processing each received partial data block, the processing means being configured for executing generating at least a subset of parity symbols from the received set of data symbols, and computing an item of reliability information as a function of at least the received parity symbols and parity symbols generated from a received set of data symbols;

comparing means for comparing the items of computed reliability information with each other; and selecting means for selecting one received set of data bits as a function of comparing the items of computed reliability information with each other.

13. The apparatus of claim 12, wherein the processing means are further configured so that computing an item of reliability information as a function of at least the received parity symbols and generated parity symbols comprises comparing the received subset of parity symbols with the corresponding subset of generated parity symbols.

14. The apparatus of claim 13, wherein the processing means are further configured so comparing the received subset of parity symbols with the corresponding subset of generated parity symbols comprises computing a distance between the parity symbols of the received subset and of the corresponding subset of generated parity symbols.

15. The apparatus of claim 14, wherein the selected received set of data symbols is the received set of data symbols corresponding to the smallest distance between the parity symbols of the received subset and of the corresponding subset of generated parity symbols.

16. The apparatus of claim 12, wherein the processing means are configured to generate a set of (n−k) parity symbols for each received partial data block and are configured so computing an item of reliability information as a function of at least the received parity symbols and generated parity symbols comprises replacing parity symbols of a generated set of parity symbols by received parity symbols to obtain a modified set of parity symbols, the item of reliability information being computed as a function of at least the modified set of parity symbols and the received data symbols.

17. The apparatus of claim 16, wherein the processing means are configured so that computing an item of reliability information as a function of at least the received parity symbols and generated parity symbols comprises computing a product of a parity check matrix and a vector resulting from the concatenation of the received data symbols and the modified set of parity symbols.

18. The apparatus of claim 12, wherein the processing means are configured so that computing an item of reliability information as a function of at least the received parity symbols and parity symbols generated from a received set of data symbols comprises computing the item of reliability information as a function of at least the received parity symbols and parity symbols generated from data symbols of the partial data block being processed.

19. The apparatus of claim 12 further comprising:
second receiving means for receiving, in at least one receiver of the plurality of receivers, a data block comprising the set of k data symbols and a set of (n−k) parity symbols; and
second selecting means for selecting the subset of (m−k) parity symbols from among the received set of (n−k) parity symbols.

20. The apparatus of claim 19 further comprising transmitting means for transmitting the partial data block from the at least one receiver to a controller, the controller comprising means for receiving, from each receiver of a plurality of receivers, a partial data block transmitted by one emitter, the received partial data block comprising a set of k data symbols and a subset of (m−k) parity symbols.

* * * * *